(12) United States Patent
Akhter et al.

(10) Patent No.: US 6,903,665 B2
(45) Date of Patent: Jun. 7, 2005

(54) METHOD AND APPARATUS FOR ERROR CONTROL CODING IN COMMUNICATION SYSTEMS USING AN OUTER INTERLEAVER

(75) Inventors: Mohammad Shahanshah Akhter, Kanata (CA); Robert Wood, Gloucester (CA); Antonio Mascioli, Nepean (CA)

(73) Assignee: SpaceBridge Semiconductor Corporation, Hull (CA)

( * ) Notice: Subject to any disclaimer, the term of this patent is extended or adjusted under 35 U.S.C. 154(b) by 0 days.

(21) Appl. No.: 10/695,910

(22) Filed: Oct. 30, 2003

(65) Prior Publication Data

US 2004/0139378 A1 Jul. 15, 2004

Related U.S. Application Data

(60) Provisional application No. 60/422,169, filed on Oct. 30, 2002, and provisional application No. 60/433,583, filed on Dec. 16, 2002.

(51) Int. Cl.[7] ............................................... H03M 7/00
(52) U.S. Cl. ......................... 341/50; 714/755; 714/790
(58) Field of Search .......................... 375/326; 714/755, 714/790; 341/51, 50

(56) References Cited

U.S. PATENT DOCUMENTS 5,793,818 A * 8/1998 Claydon et al. ............ 375/326
6,516,437 B1 * 2/2003 Van Stralen et al. ........ 714/755
6,728,927 B2 * 4/2004 Crozier ....................... 714/790

OTHER PUBLICATIONS

Stralen et al. (U.S. Appl. No. 10/356,872) "Turbo decoder control for use with a programmable inteleaver variable bloc length and multiple code rates", filed Feb. 3, 2003.*
Gray, U.S. Appl. No. 09/849,742, "Error Floor Turbo Codes", filed May 4, 2001.*

* cited by examiner

Primary Examiner—Jean Bruner Jeanglaude
(74) Attorney, Agent, or Firm—L. Anne Kinsman; Borden Ladner Gervais LLP

(57) ABSTRACT

A data encoder for encoding a codeword having a plurality of symbols for transmission through a data channel comprises a turbo encoder which has an interleaver, first and second RSC encoders, a puncturer and a mapper. The interleaver receives the codeword and provides an interleaved codeword. The first RSC encoder is for receiving the codeword and providing first parity bits in accordance with the codeword. The second RSC encoder is for receiving the interleaved codeword from the interleaver and providing second parity bits in accordance with the interleaved codeword. The puncturer is for receiving the codeword, the first parity bits and the second parity bits, and for puncturing at least the first and second parity bits in accordance with a pattern of a desired code rate. The mapper is for receiving the punctured parity bits, and for providing signal sets in accordance with the desired code rate.

16 Claims, 10 Drawing Sheets

METHOD AND APPARATUS FOR ERROR CONTROL CODING IN COMMUNICATION SYSTEMS USING AN OUTER INTERLEAVER

CROSS-REFERENCE TO RELATED APPLICATIONS

This application claims the benefit of priority to U.S. Provisional Application No. Ser. 60/422,169, filed Oct. 30, 2002, and to U.S. Provisional Application No. Ser. 60/433,583, filed Dec. 16, 2002, the contents of both of which are expressly incorporated herein by reference.

FIELD OF THE INVENTION

The present invention relates generally to communication codecs. More particularly, the present invention relates to codecs for implementing turbo encoding using interleavers, recursive systematic convolutional encoders and puncturing.

BACKGROUND OF THE INVENTION

Turbo coding is well known in the art to provide high code rate communications on noisy channels by introducing parity symbols computed by recursive systematic convolutional (RSC) encoders. In many implementations a pair of RSC encoders are used, with one of the encoders being provided with an interleaved copy of the source data, and the other receiving a non-interleaved copy of the source data. The results of the pair of RSC encoders is provided to a puncturer, which also receives as input a copy of the original data. The parity codes generated by the RSC encoders are punctured with the data symbols in a predetermined pattern, so that a decoder can iteratively process the received data stream and derive an estimate of the original data.

The use of interleavers in front of both the RSC encoders requires that the interleavers be selected so that their interleaving properties, in conjunction with the RSC polynomial, allow the puncturer to generate code words that have a sufficient distance from each other to allow for error correction.

As noise can never be removed from a physical channel, and increasing the reliability of a communications channel will allow for an effective increase in the capacity of the channel, it is desirable to provide a turbo code implementation that can provide improved performance.

SUMMARY OF THE INVENTION

It is an object of the present invention to obviate or mitigate at least one disadvantage of previous turbo codecs that can be provided as an all digital solution.

A first aspect of the present invention provides a data encoder for encoding a codeword having a plurality of symbols for transmission through a data channel. The data encoder comprises a turbo encoder having an interleaver for receiving the codeword and providing an interleaved codeword; first and second recursive systematic convolutional (RSC) encoders, the first RSC encoder for receiving the codeword and providing first parity bits in accordance with the codeword, the second RSC encoder for receiving the interleaved codeword from the interleaver and providing second parity bits in accordance with the interleaved codeword; a puncturer for receiving the codeword, the first parity bits and the second parity bits, and for puncturing at least the first and second parity bits in accordance with a pattern of a desired code rate; and a mapper for receiving the punctured parity bits, and for providing signal sets in accordance with the desired code rate.

Preferably the interleaver is a modified dithered relatively prime interleaver, and the first and second RSC encoders are rate 2/3, 8 state RSC encoders. Polynomials for the rate 2/3, 8 state RSC encoders using tail-biting termination are chosen such that, for 25600-bit codeword, a final state of a first pass through the RSC encoder having bit positions [0 1 2 3 4 5 6 7], a final state of a second pass through the RSC encoder yields bit positions [0 5 1 4 2 7 3 6]. The data encoder can include a Reed-Solomon encoder for encoding the codeword prior to receipt by the turbo encoder, and a Forney interleaver disposed between the Reed-Solomon encoder and the turbo encoder, for interleaving the symbols in the codeword prior to receipt by the turbo encoder.

In a further embodiment, the data encoder can include a further interleaver coupled to a further RSC encoder, the further interleaver receiving the codeword and providing a further interleaved codeword to the further RSC encoder, the further RSC encoder providing further parity bits to the puncturer.

In a further aspect, there is provided a turbo encoder system for encoding a digital signal including a codeword having a plurality of symbols. The turbo encoder system comprises a Reed-Solomon encoder, for receiving and encoding the codeword; a Forney interleaver for receiving from the Reed Solomon encoder, the encoded codeword, and for interleaving the symbols in the codeword according to a predetermined interleaver index; and a turbo encoder for receiving the interleaved encoded codeword from the Forney interleaver the turbo encoder having at least one modified dithered relatively prime interleaver for interleaving the codeword, at least two RSC encoders for encoding the codeword and the interleaved codeword, respectively, and a puncturer for puncturing the codeword, the encoded codeword, and the interleaved and encoded codeword to provide a turbo codeword.

In yet another aspect, the present invention provides a turbo coding method. The method comprises steps of encoding a plurality of codewords according to a Reed-Solomon (RS) outer code; interleaving the plurality of RS encoded codewords; providing each of the plurality of interleaved codewords to a first RSC encoder for encoding using a systematic recursive convolutional constituent (RSCC) code to provide first parity bits; providing each of the plurality of interleaved codewords to an interleaver coupled to a second RSC encoder for interleaving each codeword and for encoding each doubly interleaved codeword using a RSCC code to provide second parity bits; puncturing the first and second parity bits in accordance with a pattern of a desired code rate; and mapping the punctured parity bits to provide signal sets in accordance with the desired code rate. Preferably, the the interleaving of each of the plurality of RS encoded codewords consists of interleaving using a modified dithered relatively prime interleaving mapping.

The turbo coding method can further include steps of transmitting the signal sets, receiving the transmitted signal set, and decoding the signal set using standard log-maximum-a-posteriori-probability (log-MAP) decoding. Early stopping can also be used in the decoding of the turbo codeword.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a method and system for a turbo code and its functional implementation. The turbo code of the present invention includes, but is not limited to, the overall encoding method which include distinct polynomials for each constituent encoder, an interleaving method, a puncturing method and encoding using pragmatic trellis code modulation (TCM). Functional implementations include the encoding method as well as the decoding method, and include but are not limited to a decoding process where a MAP algorithm is used in conjunction with iterative processing. Three embodiments of the present invention are described.

Figure 1:
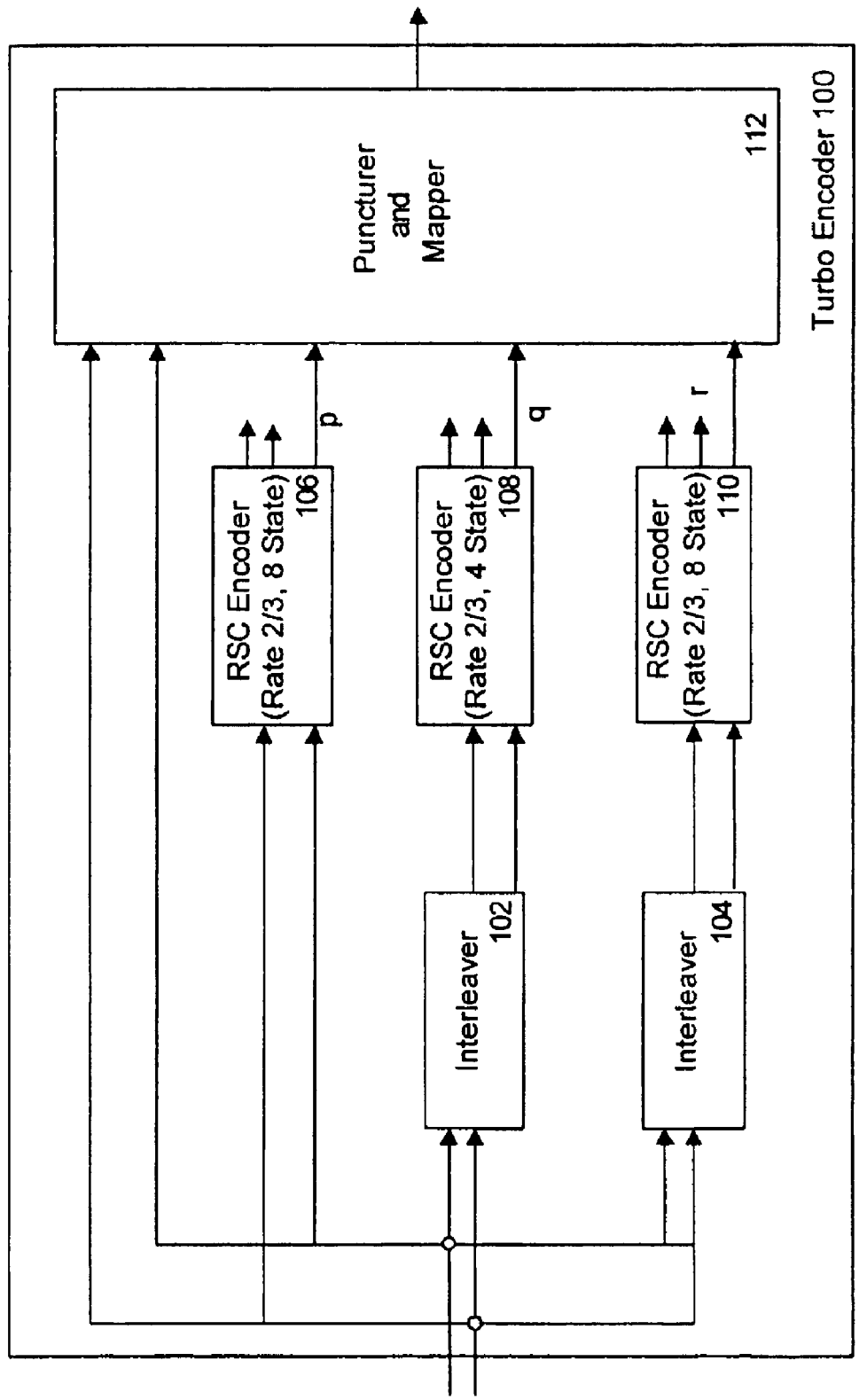
FIG. 1 is an illustration of a turbo encoder according to a first embodiment of the present invention.

FIG. 1 illustrates a three layer concatenated turbo encoder 100 according to a first embodiment of the present invention. Turbo encoder 100 comprises two interleavers 102, 104, three RSC encoders 106, 108, 110, and a puncturer 112. The two interleavers 102, 104 are selected so that they sufficiently interleave the received source codes such that after the corresponding RSC encoders 108, 110 encode the interleaved copy of the source code, the resulting code words have a high distance property. It has been found that dithered interleavers, including dithered relative prime interleavers, provide such a high distance interleaving. The first RSC encoder 106 creates a set of parity symbols corresponding to the source codewords. The rate of the first encoder 106 is preferably 2/3, and the encoder 106 is preferably an 8 state encoder, such that there are three memory elements storing source codewords that are used in each convolutional encoding. The second RSC encoder 108 creates a set of parity symbols corresponding to a first set of interleaved codewords that correspond to the source codewords. The rate of the second RSC encoder 108 is preferably 2/3, and the encoder is preferably a 4 state encoder, so that there are a pair of memory elements storing interleaved source codewords that are used in each convolutional encoding. The third RSC encoder 110 creates a set of parity symbols corresponding to a second set of interleaved codewords that correspond to the source codewords. The rate of the third RSC encoder 110 is preferably 2/3, and the encoder 110 is preferably an 8 state encoder, so that there are three memory elements storing interleaved source codewords that are used in each convolutional encoding. The output of the three RSC encoders 106, 108, 110 is provided to puncturer 112 along with the source codewords. The selection of the interleavers and RSC polynomials allows the creation of a triple concatenation code that arises from the puncturing of the parity symbols. Choosing polynomials and interleavers with sufficient distance results in encoders that provide a substantially improved distance metric, which corresponds to a greater ability to correct the errors that arise from channel conditions.

Pairs of bits are interleaved by interleaver 102 and interleaver 104. Therefore, the interleaver length is 8192. The pairs are kept together during the interleaving process. The row number of the interleaver files corresponds to the interleaved index I, and the value on that line gives the corresponding natural index j. Furthermore, when the interleaved index I is even, the bit pairs are swapped. These interleavers can be generated using relatively simple circuits.

In the embodiment of the turbo encoder 100 illustrated in FIG. 1, three rate 2/3 systematic recursive convolutional constituent codes and two interleavers are used. The number of states of each constituent code is different. RSC encoder 106 and RSC encoder 110 are both 8 state encoders, and RSC encoder 108 is a 4 state encoder. Each turbo code word consists of 16384 bits, or 8192 pairs. The earlier bit in each pair is mapped to the LSB of the pair.

Figure 2:
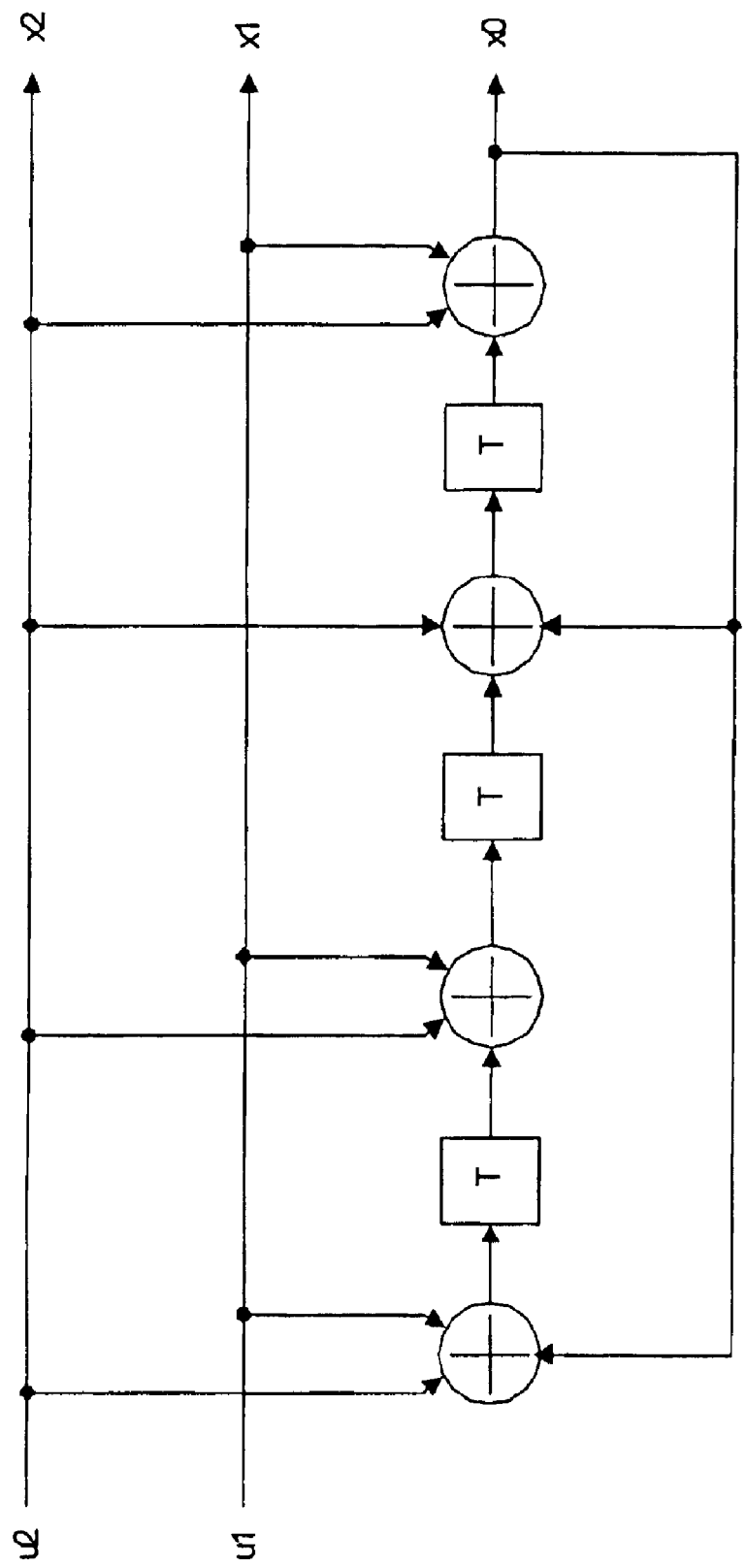
FIG. 2 is an illustration of an 8 state RSC encoder according to an embodiment of the present invention.
Figure 3:
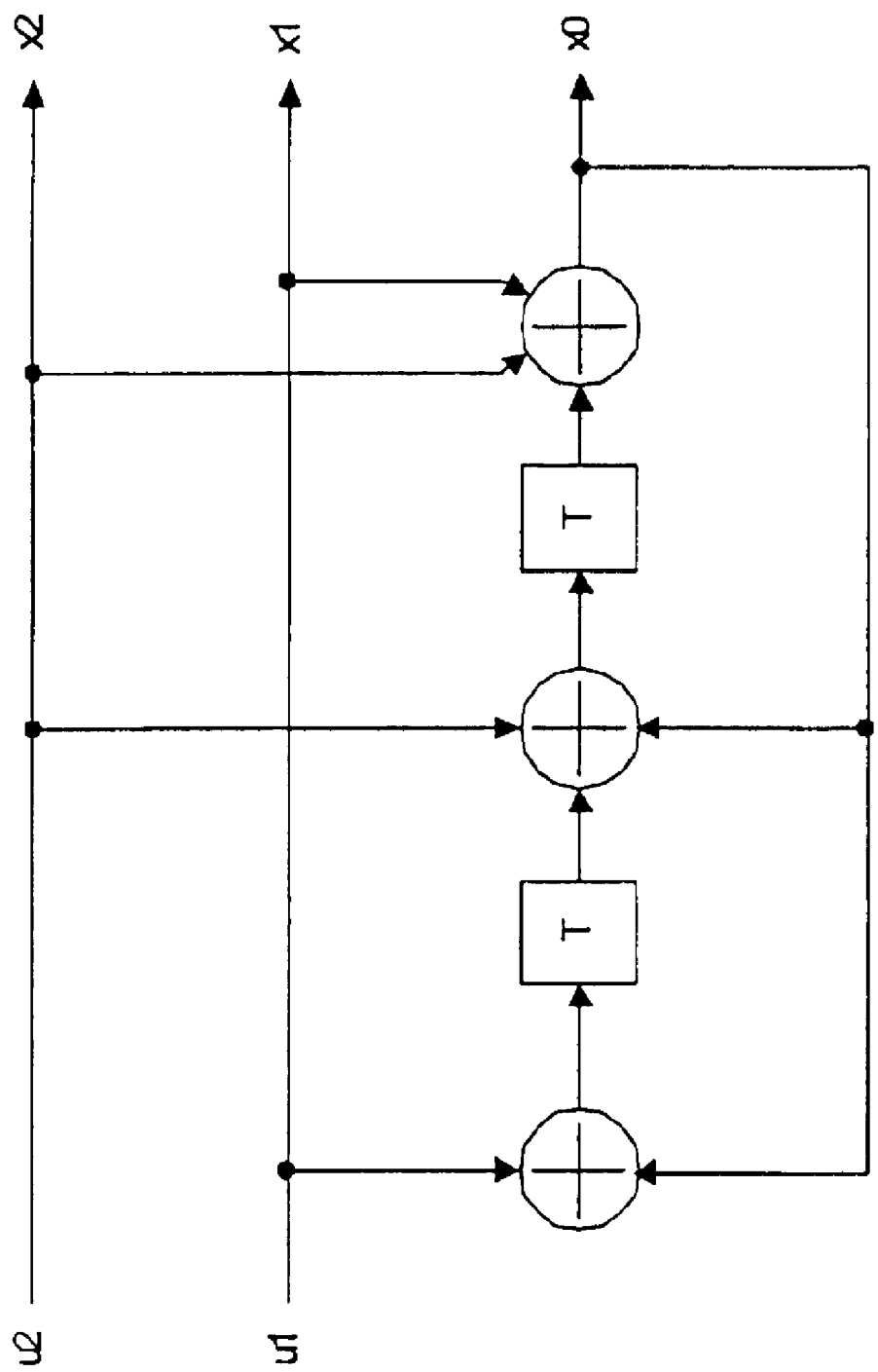
FIG. 3 is an illustration of a 4 state RSC encoder according to an embodiment of the present invention.

FIGS. 2 and 3 illustrate the 8 and 4 state RSC encoders employed in FIG. 1. The first bit of a frame is mapped to u1, the second to u2, and so on. Only output x0 is passed to the puncture circuit; outputs x1 and x2 are not connected.

Tail-biting termination is preferably used in each constituent encoder, two passes of each encoder are required. First the encoder is initialised to an all-zeros state $s_0=0$, and then an entire frame is run through the encoder (the outputs are unused). The final state $S_N$ is used to determine the starting state for the second pass, i.e. $S'_0=f[S_N]$. The entire frame is run through the encoder a second time, this time outputting to puncturer 112. At the conclusion of the second pass the final state $s'_N$ will be equal to the initial state $s'_0$.

The intial state look up table for a 4 state encoder and a 16384 bit frame is given in Table 1. The initial state look up table for an 8 state encoder and a 16384 bit frame is given in Table 2. The least significant bit (LSB) of the state number is the right-most bit of shift register in the encoder diagrams.

TABLE 1–4

State Encoder Tail Biting

| Final State $s_N$ | Initial State $s'_0$ |
| --- | --- |
| 0 | 0 |
| 1 | 2 |
| 2 | 3 |
| 3 | 1 |

TABLE 2–8

State Encoder Tail Biting

| Final State $s_N$ | Initial State $s'_0$ |
| --- | --- |
| 0 | 0 |
| 1 | 3 |
| 2 | 6 |
| 3 | 5 |
| 4 | 7 |

TABLE 2–8-continued

State Encoder Tail Biting

| Final State $s_N$ | Initial State $s'_0$ |
|---|---|
| 5 | 4 |
| 6 | 1 |
| 7 | 2 |

The systematic bits are never punctured in the presently preferred embodiment. They are input to a 1 bit wide systematic FIFO register in the order they are received. The p, q, and r parity bits from RSC encoder 106, RSC encoder 108, and RSC encoder 110, respectively, are punctured and input to three separate 1 bit wide FIFOs: Parity p FIFO, Parity q FIFO, and Parity r FIFO. The puncture pattern for rate 1/2 QPSK is shown in Table 3. The puncture pattern for rate 3/4 QPSK is shown in Table 4. The puncture pattern for rate 2/3 8PSK is shown in Table 5. The puncture pattern for rate 5/6 8PSK is shown in Table 6.

TABLE 3

Code 1 Rate ½ QPSK Puncture Pattern

| p | 11 |
|---|---|
| q | 10 |
| r | 01 |

TABLE 4

Cod 1 Rate ¾ QPSK Puncture Pattern

| p | 100100100100100100100100100100100100 |
|---|---|
| q | 100000010000001000000100000010000001 |
| r | 100000100000100000100000100000100000 |

TABLE 5

Code 1 Rate ⅔ 8PSK Puncture Pattern

| p | 1010 |
|---|---|
| q | 0100 |
| r | 0001 |

TABLE 6

Code 1 Rate ⅚ 8PSK Puncture Pattern

| p | 0000100001 |
|---|---|
| q | 1000000000 |
| r | 0000010000 |

Figure 4:
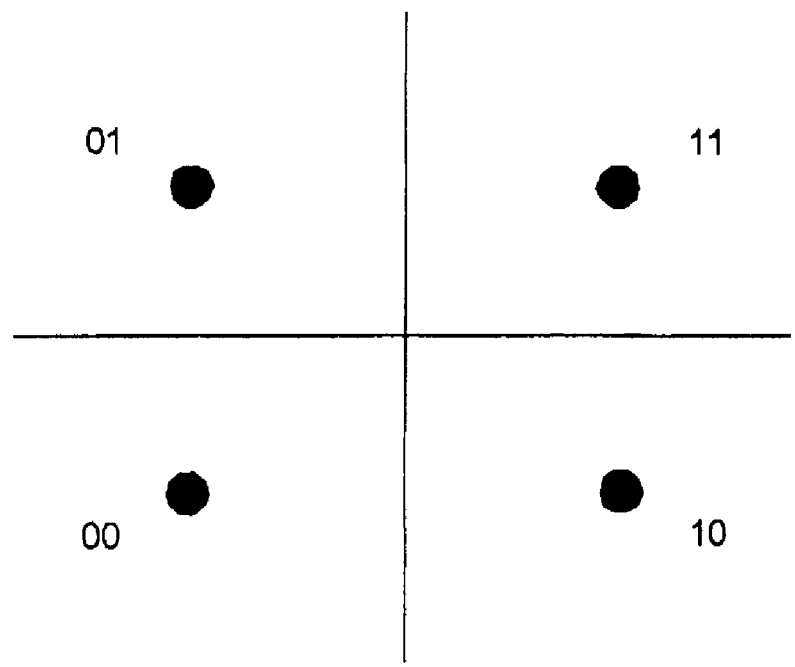
FIG. 4 illustrates the QPSK signal set of an embodiment of the present invention.
Figure 5:
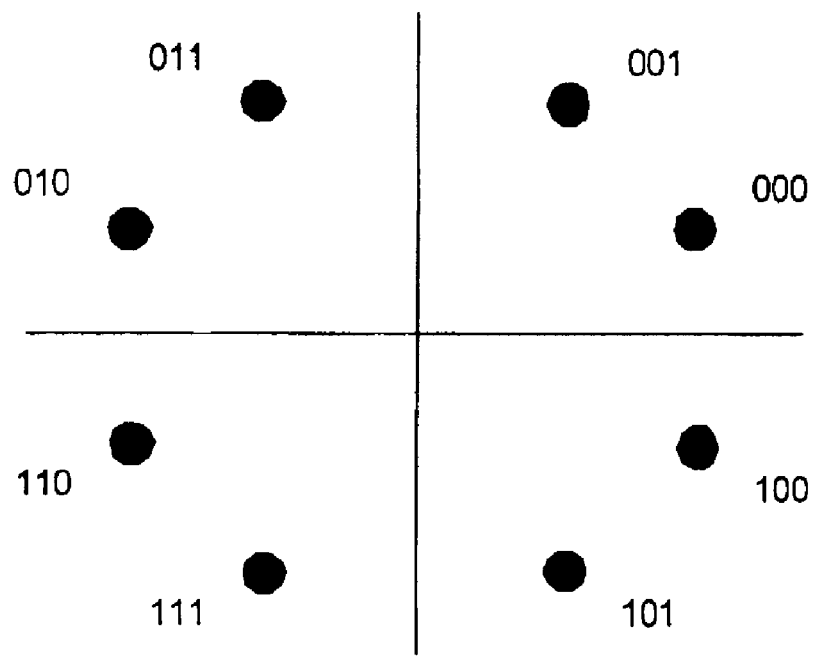
FIG. 5 illustrates the 8PSK signal set of an embodiment of the present invention.

Bits are read from the FIFO registers in the puncturer 112 and mapped into signal sets. A QPSK signal set is shown in FIG. 4, and an 8PSK signal set is shown in FIG. 5. The specific mapping for each case is described below. For rate 1/2, QPSK symbols are formed as follows. A first QPSK symbol is by reading two bits from the systematic FIFO. The first bit is the MSB of the symbol, and the second bit is the LSB. A second QPSK symbol is formed by reading one bit each from the Parity p FIFO and the Parity q FIFO. The p bit is the MSB of the symbol, and the q bit is the LSB. A third QPSK symbol is formed by reading two bits from the systematic FIFO. The first bit is the MSB of the symbol, and the second bit is the LSB. A fourth QPSK symbol is formed by reading one bit each from the Parity p FIFO and the Parity r FIFO. The p bit is the MSB of the symbol, and the r bit is the LSB. These steps are then repeated.

For rate 3/4, QPSK symbols are formed as follows A first QPSK symbol is formed by reading two bits from the systematic FIFO. The first bit is the MSB of the symbol, and the second bit is the LSB. A second QPSK symbol is formed by reading one bit each from the Parity p FIFO and the Parity r FIFO. The p bit is the MSB of the symbol, and the r bit is the LSB. A third QPSK symbol is formed by reading two bits from the systematic FIFO. The first bit is the MSB of the symbol, and the second bit is the LSB. A fourth QPSK symbol is formed by reading two bits from the systematic FIFO. The first bit is the MSB of the symbol, and the second bit is the LSB. A fifth QPSK symbol is formed by reading two bits from the systematic FIFO. The first bit is the MSB of the symbol, and the second bit is the LSB. A sixth QPSK symbol is formed by reading one bit each from the Parity p FIFO and the Parity q FIFO. The p bit is the MSB of the symbol, and the q bit is the LSB. A seventh QPSK symbol is formed by reading two bits from the systematic FIFO. The first bit is the MSB of the symbol, and the second bit is the LSB. An eighth QPSK symbol is formed by reading two bits from the systematic FIFO. The first bit is the MSB of the symbol, and the second bit is the LSB. These steps are then repeated.

For rate 2/3, 8PSK symbols are formed as follows. A first 8PSK symbol is formed by reading two bits from the systematic FIFO and one bit from the Parity p FIFO. The first bit from the systematic FIFO is the MSB of the symbol, and the p bit is the LSB. A second 8PSK symbol is formed by reading two bits from the systematic FIFO and one bit from the Parity q FIFO. The first bit from the systematic FIFO is the MSB of the symbol, and the q bit is the LSB. A third 8PSK symbol is formed by reading two bits from the systematic FIFO and one bit from the Parity p FIFO. The first bit from the systematic FIFO is the MSB of the symbol, and the p bit is the LSB. A fourth 8PSK symbol is formed by reading two bits from the systematic FIFO and one bit from the Parity r FIFO. The first bit from the systematic FIFO is the MSB of the symbol, and the r bit is the LSB. These steps are then repeated.

For rate 5/6, 8PSK symbols are formed as follows. A first 8PSK symbol is formed by reading two bits from the systematic FIFO and one bit from the Parity q FIFO. The first bit from the systematic FIFO is the MSB of the symbol, and the q bit is the LSB. A second 8PSK symbol is formed by reading three bits from the systematic FIFO. The first bit from the systematic FIFO is the MSB of the symbol, and the third bit is the LSB. A third 8PSK symbol is formed by reading three bits from the systematic FIFO. The first bit from the systematic FIFO is the MSB of the symbol, and the third bit is the LSB. A fourth 8PSK symbol is formed by reading two bits from the systematic FIFO and one bit from the Parity p FIFO. The first bit from the systematic FIFO is the MSB of the symbol, and the p bit is the LSB. A fifth 8PSK symbol is formed by reading two bits from the systematic FIFO and one bit from the Parity r FIFO. The first bit from the systematic FIFO is the MSB of the symbol, and the r bit is the LSB. A sixth 8PSK symbol is formed by reading three bits from the systematic FIFO. The first bit from the systematic FIFO is the MSB of the symbol, and the third bit is the LSB. A seventh 8PSK symbol is formed by reading three bits from the systematic FIFO. The first bit from the systematic FIFO is the MSB of the symbol, and the third bit is the LSB. An eighth 8PSK symbol is formed by reading two bits from the systematic FIFO and one bit from the Parity p FIFO. The first bit from the systematic FIFO is the MSB of the symbol, and the p bit is the LSB. These steps are then repeated.

To decode a codeword encoded according to the present invention, a decoder uses a standard log-MAP decoding algorithm. The use of three constituent codes means that each decoder iteration will consist of three subiterations. The extrinsic input to each MAP decoder is simply the sum of the extrinsic output of the other two MAP decoders.

Figure 6:
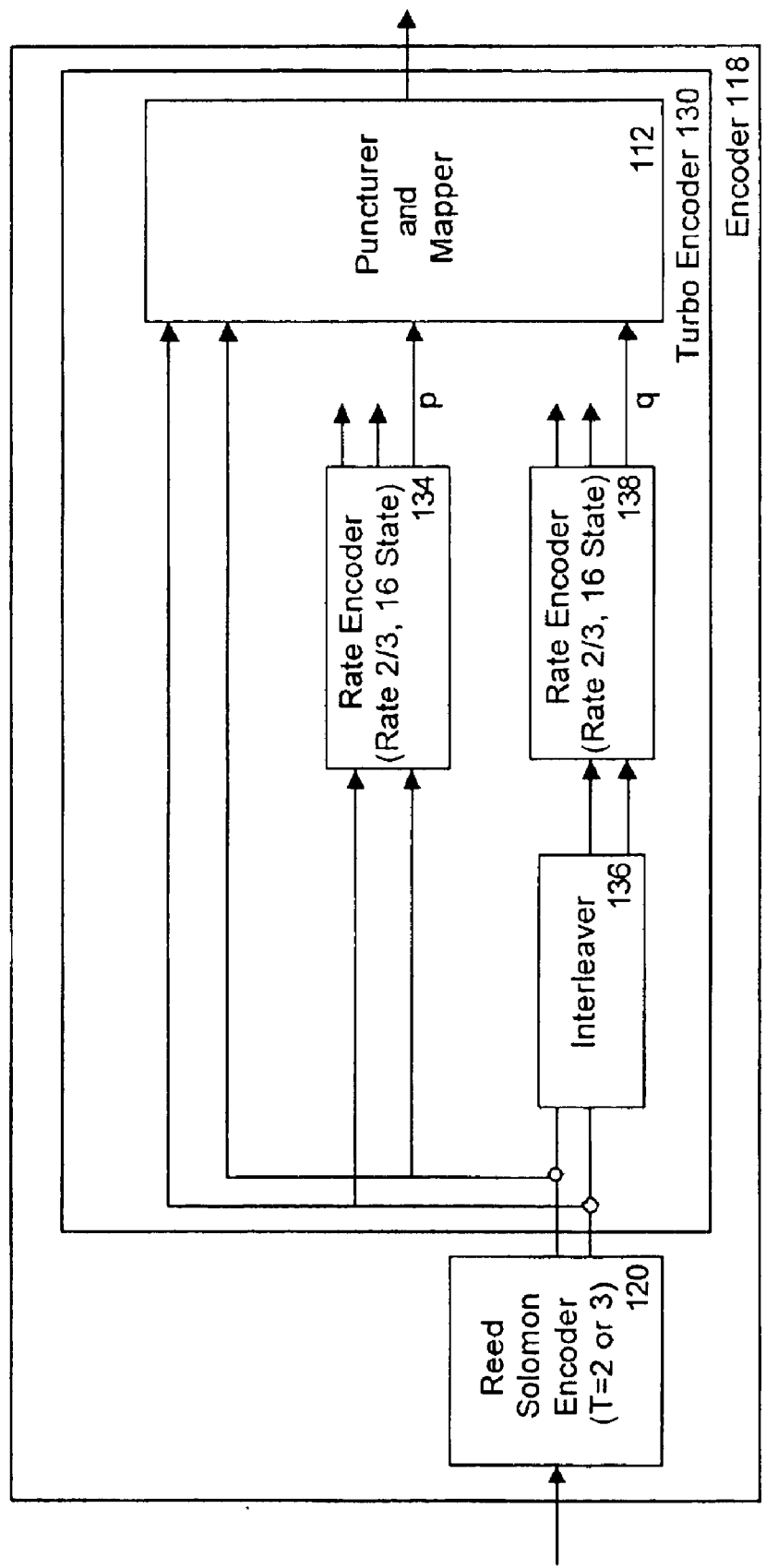
FIG. 6 is an illustration of an encoder according to a second embodiment of the present invention.

FIG. 6 illustrates an encoder 118 according to a second embodiment of the present invention. Encoder 118 uses a T=2 or T=3 Reed Solomon (RS) encoder 120 to encode the source codewords prior to a two stage turbo encoder 130. In the embodiment illustrated in FIG. 6, two rate 2/3 systematic recursive convolutional constituent codes and one interleaver are used. The error floor for this code alone is above 1e–10, therefore the outer RS code is needed. However, the error floor of the code is low enough that this outer code only needs to be weak. The outer code is preferably a t=2 RS(255, 251) Reed-Solomon code. No interleaver is required between the inner and outer codes (although interleaving within one turbo code frame could be performed with no increase in complexity). A slight increase in spectral efficiency can be achieved by using an extended RS(256, 252) code.

Figure 7:
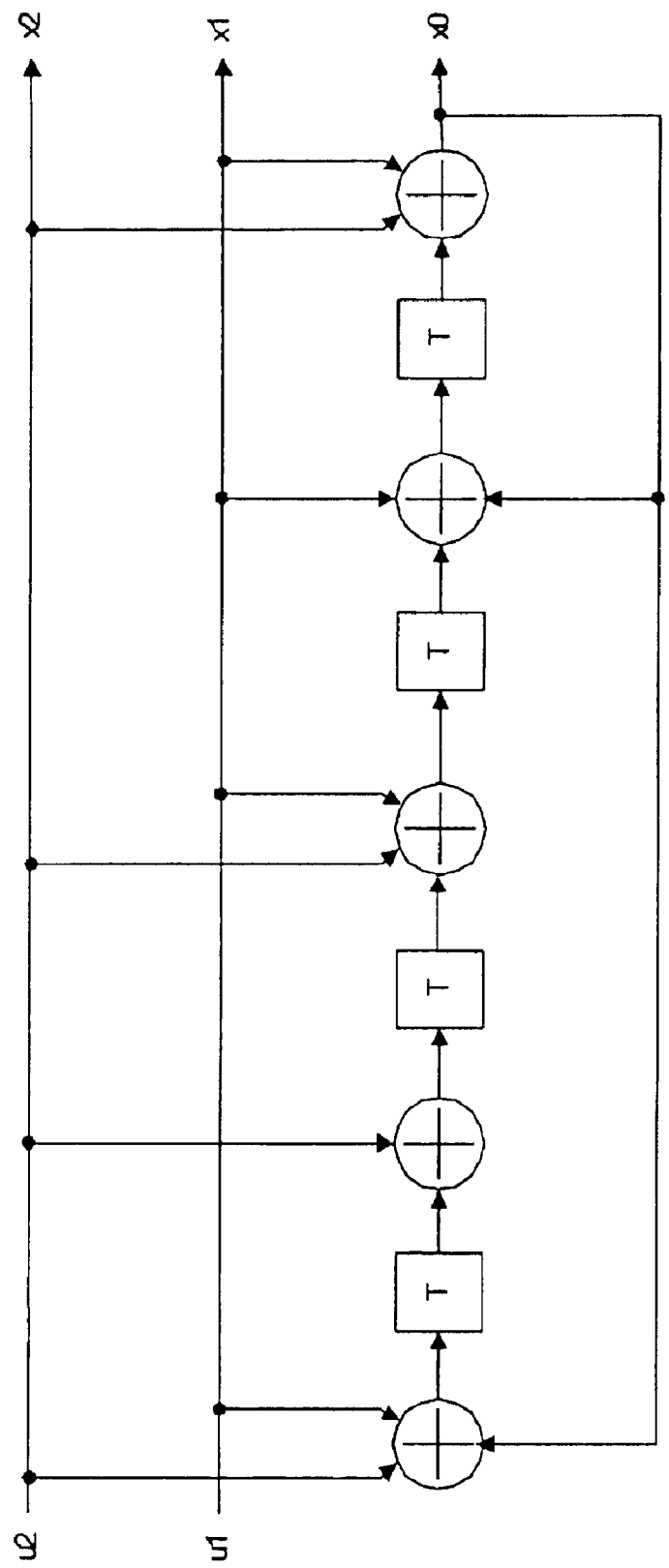
FIG. 7 is an illustration of a 16 state RSC encoder according to an embodiment of the present invention.

The RS encoded source codewords are provided to a puncturer 132, an RSC encoder 134, and an interleaver 136 in parallel. The output of the interleaver 136 is provided to a second RSC encoder 138. The encoders 134, 138 are both rate 2/3 16 state encoders having a 4 symbol memory so that each generated parity symbol is based on the 4 symbols in the encoder memory. The interleaver 136 is preferably a modified dithered interleaver, but any high distance interleaver in conjunction with a corresponding polynomial can be employed to produce a final set of parity symbols that have a high distance property after puncturing so that errors can be corrected through iterative decoding that is known to those skilled in the art.m Both RSC encoder 134 and RSC encoder 138 are 16 state codes. The 16 state encoder used for RSC encoder 134 and RSC encoder 138 is shown in FIG. 7. The first bit of the frame is mapped to u1, the second to u2, and so on. Only output x0 is passed to the puncture circuit; outputs x1 and x2 are not connected.

The initial state look up table for a 16 state encoder and a 16384 bit frame is given in Table 7. The LSB of the state number is the right-most bit of each shift register in the encoder grams.

TABLE 7–16

State Encoder Tail Biting

| Final State $s_N$ | Initial State $s'_0$ |
|---|---|
| 0 | 0 |
| 1 | 10 |
| 2 | 7 |
| 3 | 13 |
| 4 | 14 |
| 5 | 4 |
| 6 | 9 |
| 7 | 3 |
| 8 | 15 |
| 9 | 5 |
| 10 | 8 |
| 11 | 2 |
| 12 | 1 |

TABLE 7–16-continued

State Encoder Tail Biting

| Final State $s_N$ | Initial State $s'_0$ |
|---|---|
| 13 | 11 |
| 14 | 6 |
| 15 | 12 |

The systematic bits are never punctured in the presently preferred embodiment. They are input to a 1 bit wide systematic FIFO in the order they are received. The p and q parity bits from RSC encoder 134 and RSC encoder 138, respectively, are punctured and input to 2 separate 1 bit wide FIFOs: Parity p FIFO and Parity q FIFO. The pattern for rate 1/2 QPSK is shown in Table 8 (i.e. no puncturing). The puncture pattern for rate 3/4 QPSK is shown in Table 9. The puncture pattern for rate 2/3 8PSK is shown in Table 10. The puncture pattern for rate 5/6 8PSK is shown in Table 11.

TABLE 8

Code 2 Rate 1/2 QPSK Puncture Pattern

| p | 1 |
| q | 1 |

TABLE 9

Code 2 Rate 3/4 QPSK Puncture Pattern

| p | 010001100 |
| q | 010001100 |

TABLE 10

Code 2 Rate 2/3 8PSK Puncture Pattern

| p | 10 |
| q | 01 |

TABLE 11

Code 2 Rate 5/6 8PSK Puncture Pattern

| p | 0100000100000100000110000 |
| q | 0100000100000100000110000 |

Bits are read from the puncture FIFOs and mapped into signal sets. The QPSK signal set is shown in FIG. 4, and the 8PSK signal set is shown in FIG. 5. The specific mapping for each case is described below.

For rate 1/2, QPSK symbols are formed as follows. Form one QPSK symbol by reading two bits from the systematic FIFO. The first bit is the MSB of the symbol, and the second bit is the LSB. Form one QPSK symbol by reading one bit each from the Parity p FIFO and the Parity q FIFO. The p bit is the MSB of the symbol, and the q bit is the LSB. These steps are then repeated.

For rate 3/4, QPSK symbols are formed as follows. Form one QPSK symbol by reading two bits from the systematic FIFO. The first bit is the MSB of the symbol, and the second bit is the LSB. Form one QPSK symbol by reading two bits from the systematic FIFO. The first bit is the MSB of the symbol, and the second bit is the LSB. Form one QPSK symbol by reading one bit each from the Parity p FIFO and the Parity q FIFO. The p bit is the MSB of the symbol, and the q bit is the LSB. Form one QPSK symbol by reading two bits from the systematic FIFO. The first bit is the MSB of the symbol, and the second bit is the LSB. Form one QPSK symbol by reading two bits from the systematic FIFO. The first bit is the MSB of the symbol, and the second bit is the LSB. Form one QPSK symbol by reading two bits from the systematic FIFO. The first bit is the MSB of the symbol, and the second bit is the LSB. Form one QPSK symbol by reading two bits from the systematic FIFO. The first bit is the MSB of the symbol, and the second bit is the LSB. Form one QPSK symbol by reading one bit each from the Parity p FIFO and the Parity q FIFO. The p bit is the MSB of the symbol, and the q bit is the LSB. Form one QPSK symbol by reading two bits from the systematic FIFO. The first bit is the MSB of the symbol, and the second bit is the LSB. Form one QPSK symbol by reading one bit each from the Parity p FIFO and the Parity q FIFO. The p bit is the MSB of the symbol, and the q bit is the LSB. Form one QPSK symbol by reading two bits from the systematic FIFO. The first bit is the MSB of the symbol, and the second bit is the LSB. Form one QPSK symbol by reading two bits from the systematic FIFO. The first bit is the MSB of the symbol, and the second bit is the LSB. These steps are then repeated.

For rate 2/3, 8PSK symbols are formed as follows. Form one 8PSK symbol by reading two bits from the systematic FIFO and one bit from the Parity p FIFO. The first bit from the systematic FIFO is the MSB of the symbol, and the p bit is the LSB. Form one 8PSK symbol by reading two bits from the systematic FIFO and one bit from the Parity q FIFO. The first bit from the systematic FIFO is the MSB of the symbol, and the q bit is the LSB. These steps are then repeated.

Figure 8:
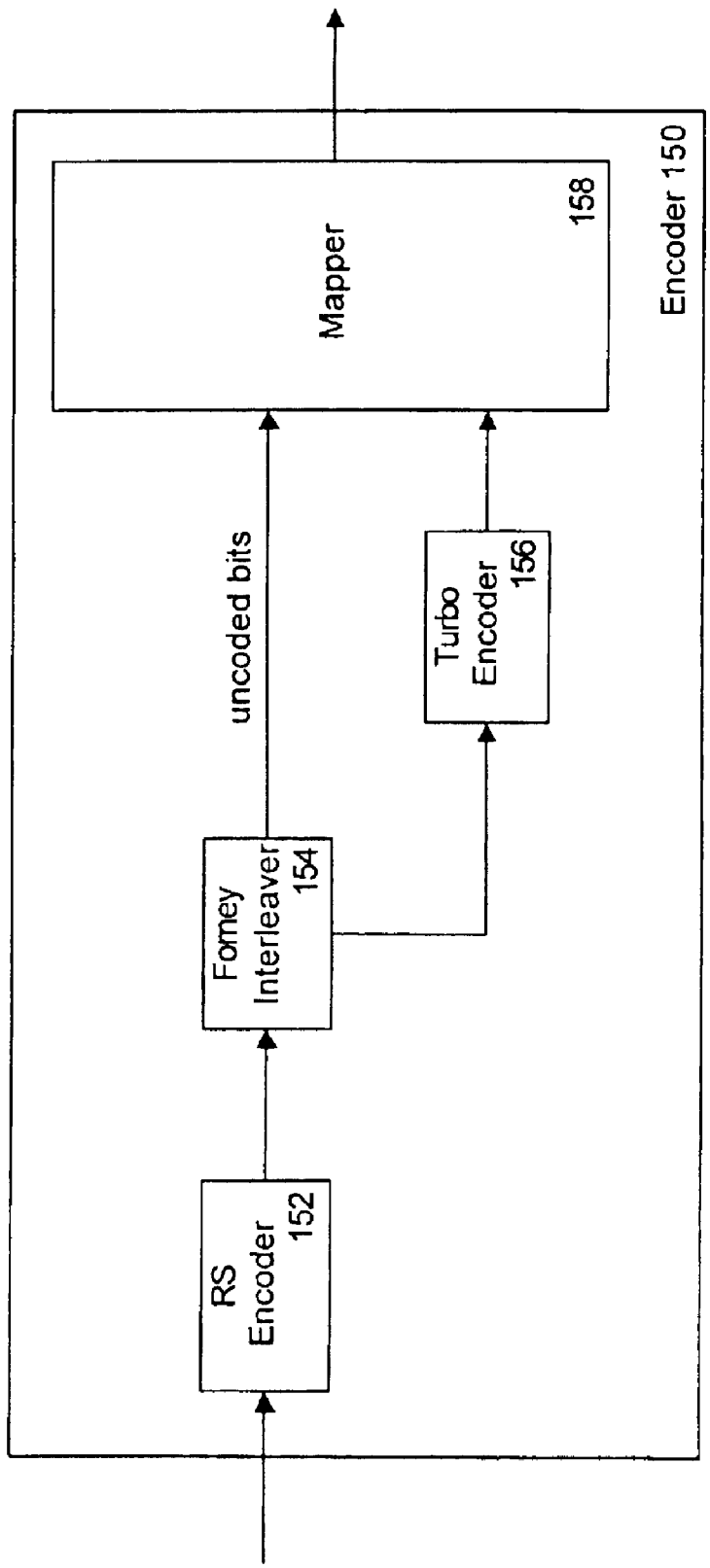
FIG. 8 is an illustration of an encoder according to a third embodiment of the present invention.

For rate 5/6, 8PSK symbols are formed as follows. Form one 8PSK symbol by reading three bits from the systematic FIFO. The first bit from the systematic FIFO is the MSB of the symbol, and the third bit is the LSB. Form one 8PSK symbol by reading three bits from the systematic FIFO. The first bit from the systematic FIFO is the MSB of the symbol, and the third bit is the LSB. Form one 8PSK symbol by reading two bits from the systematic FIFO and one bit from the Parity p FIFO. The first bit from the systematic FIFO is the MSB of the symbol, and the p bit is the LSB. Form one 8PSK symbol by reading two bits from the systematic FIFO and one bit from the Parity q FIFO. The first bit from the systematic FIFO is the MSB of the symbol, and the q bit is the LSB. These steps are then repeated.

outer Reed-Solomon (RS) code. As shown in FIG. 8, the encoder 150 comprises an RS encoder 152, the output of which is concatenated by a Forney interleaver 154, and provided to a turbo encoder 156. Incoming bits are first encoded by the RS outer encoder 152, and interleaved by the Forney interleaver 154. One skilled in the art will appreciate that other interleavers can be employed, and that the Forney interleaver is simply a presently preferred embodiment. For spectral efficiencies of 2 bits/s/Hz, and below, all the interleaved bits are encoded by the Turbo encoder 156 prior to being passed to a mapper 158. However, for spectral efficiencies above 2.5 bits/s/Hz some bits are preferably not encoded by the turbo encoder 156 and are passed directly to the mapper 158.

In one embodiment of the encoder of FIG. 8, the RS outer code is a t=6 RS (1011, 1023) code over GF(1024) is employed. The RS encoder 152 accepts 10-bit tuples from the data source and outputs 10-bit tuples to the Forney interleaver 154. A slight increase in spectral efficiency can achieved by using an extended RS (1012,1024) code. The Forney interleaver 154 has parameters N=119 and J=11. It accepts 10-bit tuples from the RS encoder 152 and outputs 10-bit tuples to the turbo encoder 156, and, in cases where pragmatic TCM is used, to the mapper 158.

Figure 9:
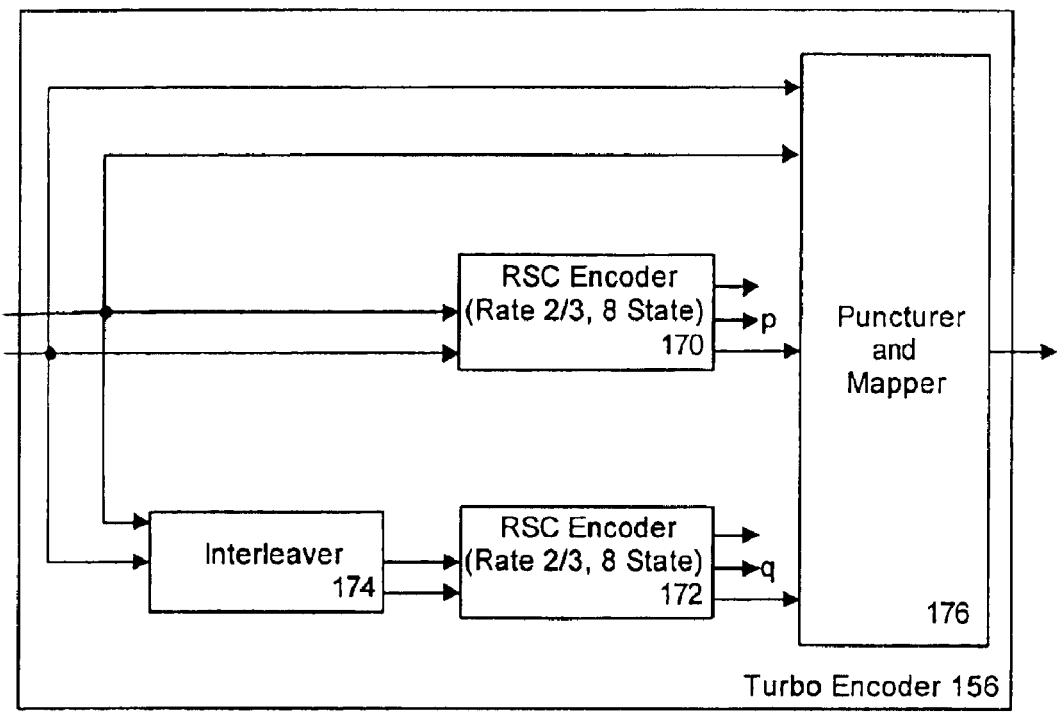
FIG. 9 is an illustration of a turbo encoder according to an embodiment of the present invention.

The structure of the turbo encoder 156 is shown in FIG. 9. Two rate 2/3, 8 state systematic recursive convolutional constituent (RSCC) codes are implemented in RSC encoders 170, 172. The outputs from Forney interleaver 154 are provided to an interleaver 174 (which is followed by the second RSC encoder 172), the first RSC encoder 170, and a puncturer and mapper 176. Thus, the puncturer 176 is provided with the Forney interleaved codeword, the parity bits p output from RSC encoder 170 and the parity bits q output from RSC encoder 172.

Interleaver 174 is a modified dithered relatively prime interleaver. Pairs of bits are interleaved by the interleaver 174. The pairs are kept together during the interleaving process. Therefore, for a 25600 bit frame the interleaver length is 12800 bit pairs, and the interleaver is completely specified by 80 seed values. These seeds are shown in Table 12. In the seed table the interleaved index I and the natural index j are shown. The first 80 natural indices corresponding to interleaved indices 0–79 are simply the values in the table. The next 80 natural indices are formed by adding 80 to the seeds modulo 12800. The next 80 natural indices are formed by adding 80 again modulo 12800, and so on. Furthermore, when the interleaved index I is even, the bit pairs are swapped.

TABLE 12

Interleaver Seed for 25600-bit interleaver

| i | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
| j | 1453 | 2270 | 6420 | 6583 | 4332 | 342 | 3072 | 2090 | 9148 | 6741 | 3687 | 12497 | 4964 | 3520 | 43 | 9633 |
| i | 16 | 17 | 18 | 19 | 20 | 21 | 22 | 23 | 24 | 25 | 26 | 27 | 28 | 29 | 30 | 31 |
| j | 3407 | 10891 | 9784 | 6111 | 5922 | 10249 | 9285 | 1923 | 3218 | 12356 | 5795 | 8056 | 8648 | 6303 | 4801 | 499 |
| i | 32 | 33 | 34 | 35 | 36 | 37 | 38 | 39 | 40 | 41 | 42 | 43 | 44 | 45 | 46 | 47 |
| j | 1606 | 10095 | 8197 | 3866 | 8345 | 2594 | 7424 | 6929 | 11413 | 9511 | 8549 | 1774 | 4555 | 7910 | 10622 | 176 |
| i | 48 | 49 | 50 | 51 | 52 | 53 | 54 | 55 | 56 | 57 | 58 | 59 | 60 | 61 | 62 | 63 |
| j | 7279 | 12199 | 7586 | 9018 | 8854 | 10760 | 692 | 12068 | 4187 | 11913 | 5171 | 2474 | 7100 | 5341 | 9966 | 2909 |
| i | 64 | 65 | 66 | 67 | 68 | 69 | 70 | 71 | 72 | 73 | 74 | 75 | 76 | 77 | 78 | 79 |
| j | 7718 | 11587 | 1010 | 12705 | 11255 | 1162 | 1325 | 4041 | 11756 | 857 | 5499 | 11084 | 4712 | 5678 | 2797 | 10448 |

The encoding and decoding in a third embodiment of the present invention are based on the concatenation of an inner parallel concatenated convolutional code (PCCC) and an The encoder structure of FIG. 2 can be employed as the 8 state constituent encoder for RSC encoders 170, 172. The first bit of the frame is mapped to u1 and the second bit is mapped to u2 and so on. Only x0 is passed to the puncturer and mapper 176; x1 and x2 are discarded.

As discussed above, tail-biting termination is preferably used in each constituent encoder, and two passes of each encoder are required. First the encoder is intialised to an all-zeros state $s_0=0$, and then an entire frame is run through the encoder (the outputs are unused). The final state $S_N$ is used to determine the starting state for the second pass, i.e. $S'_0=f[s_N]$. The entire frame is run through the encoder a second time, this time outputting to puncturer 176. At the conclusion of the second pass the final state $s'_N$ will be equal to the initial state $s'_0$.

The intial state lookup table for an 8 state encoder and a 25600 bit frame is shown in Table 13. The LSB of the state number is the right-most bit of the shift register in FIG. 2.

TABLE 13

8 State Encoder Tail Biting

| Final State $S_N$ | Initial State $S'_0$ |
| --- | --- |
| 0 | 0 |
| 1 | 5 |
| 2 | 1 |
| 3 | 4 |
| 4 | 2 |
| 5 | 7 |
| 6 | 3 |
| 7 | 6 |

Preferably, the systematic bits are never punctured. They are input to a 1 bit wide FIFO in the order they are received. This is called the systematic FIFO.

The p and q parity bits from RSC encoder 170, 172, respectively, are punctured and input to 2 separate 1 bit wide FIFOs. These are called Parity p FIFO and Parity q FIFO.

In the case of pragmatic TCM (only used for the rate 5/6 8PSK case) not all bits are encoded by the turbo encoders. These uncoded bits are input to a 1 bit wide FIFO in the order they are received. This is called the uncoded FIFO. In the case of rate 5/6 8PSK re input to the uncoded FIFO for every 3 bits that are input to the systematic FIFO.

The puncture pattern for rate 1/2 is shown in Table 14 (i.e. no puncturing).

TABLE 14

Rate 1/2 Puncture Pattern

| p | 1 |
| q | 1 |

The puncture pattern for rate 2/3 is shown in Table 15.

TABLE 15

Rate 2/3 Puncture Pattern

| p | 10 |
| q | 01 |

The puncture pattern for rate 3/4 is shown in Table 16 (used in both rate 3/4 QPSK and rate 5/6 8PSK modes).

TABLE 16

Rate 3/4 Puncture Pattern

| p | 100 |
| q | 100 |

Figure 10:
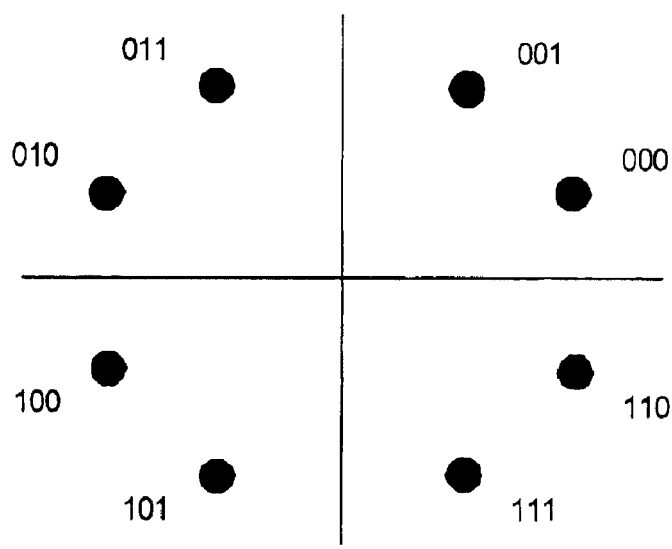
FIG. 10 illustrates an 8PSK signal set according to the embodiment of FIG. 8.

Bits are read from the FIFOs and mapped into the signal sets. The QPSK signal set is shown in FIG. 4, the Gray mapped 8PSK signal set is shown in FIG. 5, and the pragmatic TCM mapped 8PSK signal set is shown in FIG. 10. The specific mapping for each case is described below.

For rate 1/2 QPSK symbols are formed as follows. Form one QPSK symbol by reading two bits from the systematic FIFO. The first bit is the MSB of the symbol, and the second bit is the LSB. Form one QPSK symbol by reading one bit each from the Parity p FIFO and the Parity q FIFO. The p bit is the MSB of the symbol, and the q bit is the LSB. These steps are then repeated.

For rate 3/4 QPSK symbols are formed as follows. Form one QPSK symbol by reading two bits from the systematic FIFO. The first bit is the MSB of the symbol, and the second bit is the LSB. Form one QPSK symbol by reading one bit each from the Parity p FIFO and the Parity q FIFO. The p bit is the MSB of the symbol, and the q bit is the LSB. Form one QPSK symbol by reading two bits from the systematic FIFO. The first bit is the MSB of the symbol, and the second bit is the LSB. Form one QPSK symbol by reading two bits from the systematic FIFO. The first bit is the MSB of the symbol, and the second bit is the LSB. These steps are then repeated.

For rate 2/3 8PSK symbols are formed as follows (the Gray mapped 8PSK signal set is used). Form one 8PSK symbol by reading two bits from the systematic FIFO and one bit from the Parity p FIFO. The first bit from the systematic FIFO is the MSB of the symbol, and the p bit is the LSB. Form one 8PSK symbol by reading two bits from the systematic FIFO and one bit from the Parity q FIFO. The first bit from the systematic FIFO is the MSB of the symbol, and the q bit is the LSB. These steps are then repeated.

For rate 5/6 8PSK symbols are formed as follows (the Pragmatic TCM mapped 8PSK signal set is used). Form one 8PSK symbol by reading one bit from the uncoded FIFO and two bits from the systematic FIFO. The bit from the uncoded FIFO is the MSB of the symbol, the first bit from the systematic FIFO is the middle bit of the symbol, and the second bit is the LSB. Form one 8PSK symbol by reading one bit from the uncoded FIFO one bit from the Parity p FIFO, and one bit from the Parity q FIFO. The bit from the uncoded FIFO is the MSB of the symbol, the bit from the Parity p FIFO is the middle bit of the symbol, and the bit from the Parity q FIFO is the LSB. Form one 8PSK symbol by reading one bit from the uncoded FIFO and two bits from the systematic FIFO. The bit from the uncoded FIFO is the MSB of the symbol, the first bit from the systematic FIFO is the middle bit of the symbol, and the second bit is the LSB. Form one 8PSK symbol by reading one bit from the uncoded FIFO and two bits from the systematic FIFO. The bit from the uncoded FIFO is the MSB of the symbol, the first bit from the systematic FIFO is the middle bit of the symbol, and the second bit is the LSB. These steps are then repeated.

In a presently preferred embodiment, the decoder uses the standard log-MAP decoding algorithm. In the decoding process, a performance advantage can be realised through the use of early stopping. For each frame at each subiteration the absolute values of the log-likelihood ratio (LLR) are compared against a threshold before stopping the iterations. If the absolute value of the LLR falls outside the range defined by the threshold, then the iterative decoding of the received code is terminated. Therefore, the total number of iterations to decode a received codeword can vary. In some cases less than full 8 iterations (16 sub-iterations for two decoders) and in other cases more than 8 iterations is performed. As a result, a flow control algorithm is preferably employed to avoid input buffer overflow. The use of these methods can improve the efficacy of the code by between 0.1 to 0.2 dB through setting a threshold between 100 and 200 at a PER of 1e–7.

The exact calculation of LLRs in the decoder circuit requires that the mathematical operation $\log(e^A+e^B)$ be performed. In a presently preferred embodiment, this operation is closely approximated by the operation min*, which is defined as min(A,B), plus a previously-computed correction factor. In an alternate embodiment, the operation $\log(e^A+e^B)$ is approximated by the operation min(A,B), which allows for a simpler implementation in hardware, at the expense of approximately 0.15 dB degradation in BER performance at the output of the turbo decoder.

The exact calculation of LLRs in the decoder circuit requires that the mathematical operation $\log(e^A+e^B+e^C+e^D)$ be performed. In a presently preferred embodiment, the operation is closely approximated by min*(min*(A,B),min*(C,D)), where the operation min* is described above. In an alternate embodiment, the operation $\log(e^A+e^B+e^C+e^D)$ is approximated by the operation min*(min(A,B),min(C,D)), which allows for a simpler implementation in hardware, at the expense of approximately 0.05 dB degradation in BER performance at the output of the turbo decoder. One skilled in the art will appreciate that this technique can be extended to cover the case in which the log() function has a greater number of arguments.

Scaling of the extrinsic information from iteration to iteration is performed. After each subiteration the extrinsic information output from the MAP decoder is scaled. The scaling factor used is 0.9. This scaling factor is only applied during the first 5 iterations, after which the extrinsic information is no longer scaled.

The final decisions of the turbo decoder are used to determine the least significant and middle bits of each 8PSK symbol, so that a hard decision of the most significant bit can be made. However, as some of the bits defining the 8PSK symbol are parity bits, the LLRs for the parity bits must be determined in addition to the systematic bits. This means there must be a slight complexity increase in the output engine of the SISO.

If the LLR for every parity bit had to be calculated then we would require an additional 6 max* operations (assuming that we arrange the systematic bit max* operations in an order such that we can tap into them for the parity LLR calculations). However, due to puncturing only one in three parity bits are transmitted, so we only need one in three parity LLRs. Therefore we can re-use 3 max* operations to generate the parity LLRs.

The symbol rate is fixed as 55 Msym/s. Without pragmatic TCM the greatest decoder speed would be for rate 5/6 8PSK. This has a spectral efficiency of 2.5 bits/s/Hz, so the data rate that the decoder would operate at would be 137.5 Mbit/s. However, with pragmatic TCM only 60% of the bits are processed by the turbo decoder. So now in rate 5/6 8PSK mode the decoder need only operate at 82.5 Mbit/s. Therefore the greatest decoder speed will be for rate 2/3 8PSK. This has a spectral efficiency of 2 bits/s/Hz, so the data rate that the decoder would operate at would be 110 Mbit/s. Rate 3/4 QPSK has a spectral efficiency of 1.5 bits/s/Hz, so the data rate that the decoder would operate at would be 82.5 Mbit/s. Rate 1/2 QPSK has a spectral efficiency of 1 bits/s/Hz, so the data rate that the decoder would operate at would be 55 Mbit/s.

With a non-pipelined decoder architecture the maximum number of iterations can be varied according to the spectral efficiency. If the decoder can support 8 iterations at the maximum data rate then it can support more iterations at lower data rates. The maximum data rate is 110 Mbits/s. Therefore the decoder can support 8 iterations in rate 2/3 8PSK mode, 10.5 iterations in rate 3/4 QPSK and rate 5/6 8PSK modes, and 16 iterations in rate 1/2 QPSK mode.

Early stopping can be used to improve performance by allowing the decoder to perform more iterations when necessary. However, extra input buffering is required to prevent loss of data when extra iterations are used. In this design the sample memory size is dictated by the rate 1/2 QPSK mode, leading to extra input buffering being available for the other modes. An input buffer that is large enough to store 2 frames of rate 1/2 QPSK symbols is large enough to store 3 frames of rate 3/4 QPSK and rate 5/6 8PSK symbols, and 4 frames of rate 2/3 8PSK symbols.

The early stopping algorithm simply looks at the absolute value of all the LLR values computed in the output engine of the SISO decoder at the end of each subiteration. If all of these values exceed a threshold then the decoder is stopped. Early stopping is preferably not used in rate 1/2 QPSK mode. A fixed 16 iterations are preferably performed in this mode.

With early stopping some form of flow control algorithm must be implemented to prevent overflow of the input buffer. Whenever the maximum allowed iterations are used, the subsequent maximum allowed iterations must be reduced until sufficient frames are processed that require less than the maximum.

An embodiment of the flow control algorithm of the present invention is as follows:
  MaxOffset=32 for rate 2/3 8PSK
  MaxOffset=16 for rate 3/4 QPSK and rate 5/6 8PSK
  Initially MaxSubiterations=16+MaxOffset
  After decoding each frame:
    Offset=MaxSubiterations−ActualSubiterations
    If Offset>MaxOffset
      Offset=MaxOffset
    MaxSubiterations=16+Offset
Decoding of a frame is stopped if the early stopping criteria is met or the maximum number of subiterations is reached. Then the actual number of subiterations is recorded and the maximum number of subiterations for the next frame computed.

In a presently preferred embodiment, a RS decoder is used. However, in an alternate embodiment a pseudo-RS decoder can be used, rather then a full RS decoder. In one such alternate embodiment, the decoded data is divided into 1023 byte groups and compared to the original data. If t or less byte errors occur then it is assumed that the RS decoder corrects them all. If more than t byte errors occur then these errors are left. The BER and PER is calculated only for the first 1023-2t bytes in the group. This allows RS codes with differing error correction abilities to be evaluated simultaneously.

A number of modifications are possible to scale the present solution to support higher code rates, lower code rates, and higher data rates to make it suitable for various other applications. In one such scaled example, a maximum code rate of 8/9 with 8PSK is required. The use of pragmatic TCM means that the rate of the turbo code will be less than the maximum of 8/9 with 8PSK. This increase in the code rate can be achieved by increasing the amount of puncturing in the related turbo code. Simulations have revealed that that QEF operation is achievable even with Gray mapped rate 8/9 8PSK with the above described coding method. As the code rate is increased, the number of iterations supported by the same hardware will increase if the symbol rate remains fixed. Though the lowest code rate achieved through the use of the above described method is rate ½, one skilled in the art will appreciate that rates of ⅓ and ¼ can be achieved through the use of repetition. If the lowest QPSK rate is ½ then the input buffer is large enough for rate 1/4 BPSK.

In another embodiment, the highest symbol rate is 100 Msyms/s, and the highest spectral efficiency is 4 bits/s/Hz. Therefore the highest data rate that needs to be supported is 400 Mbit/s for rate 4/5 32QAM. The use of pragmatic TCM means that the rate at which the turbo decoder needs to operate is lower than this. In the case of rate 4/5 32QAM if we assume 2 uncoded bits per symbol and a rate 2/3 turbo code, the maximum data rate that the turbo decoder needs to operate at is 200 Mbit/s. This can be supported by the pipelined architecture by reducing the reuse factor to 1, and by the alternate architecture by doubling the number of SISOs. Alternatively the proposed architecture could support this data rate by reducing the number of iterations to 4.

The use of variations of turbo encoding, including tail biting turbo codes is fully anticipated, as would be other encoding advances known to those skilled in the art.

The present invention provides for an all digital implementation, that can be implemented in a codec, and does not require special circuitry that requires additional space and cost on a board. The present invention is suitable for extremely high speed communications, such as 600 Mbit/s channels. QEF performance is achieved with very low signal to noise ratio, which reduces overall system cost by reducing the cost of required power amplifiers. The present invention is suitable for burst and continuous transmission in mobile, fixed, satellite or terrestrial environments. The present invention particularly useful for encoding and decoding MPEG signals.

In a presently preferred embodiment, Gray mapping is employed where appropriate, however it is anticipated that the use of pragmatic trellis coded modulation (TCM) mapping can be implemented to achieve a further performance improvement with respect to the bit error rate (BER) at given signal to noise ratios (SNR).

Figure 11:
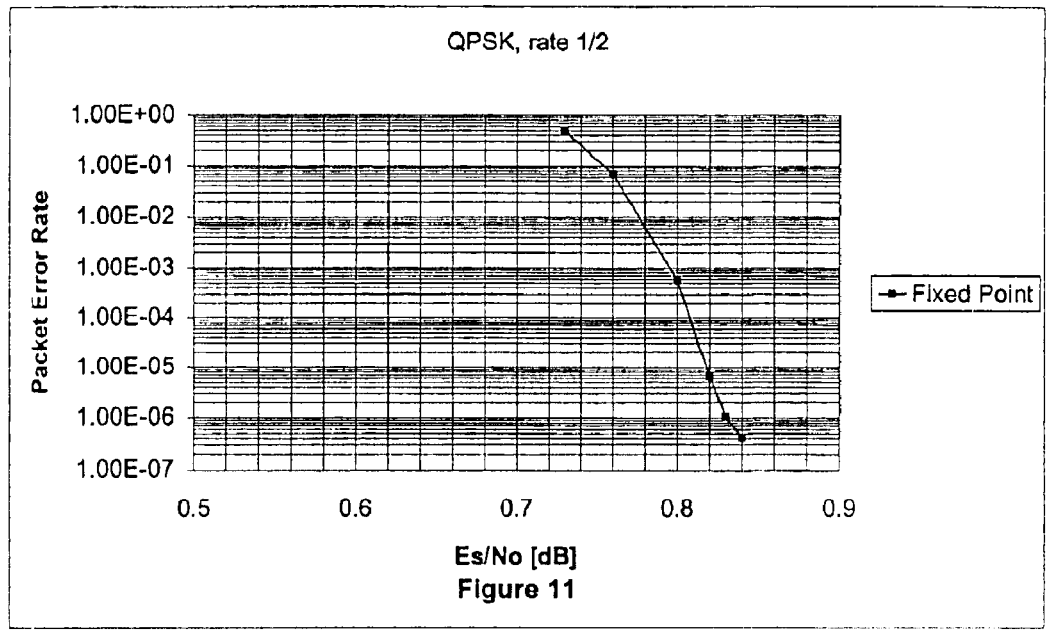
FIGS. 11–14 provide performance data of an implementation of the present invention using a sliding window PER performance.
Figure 12:
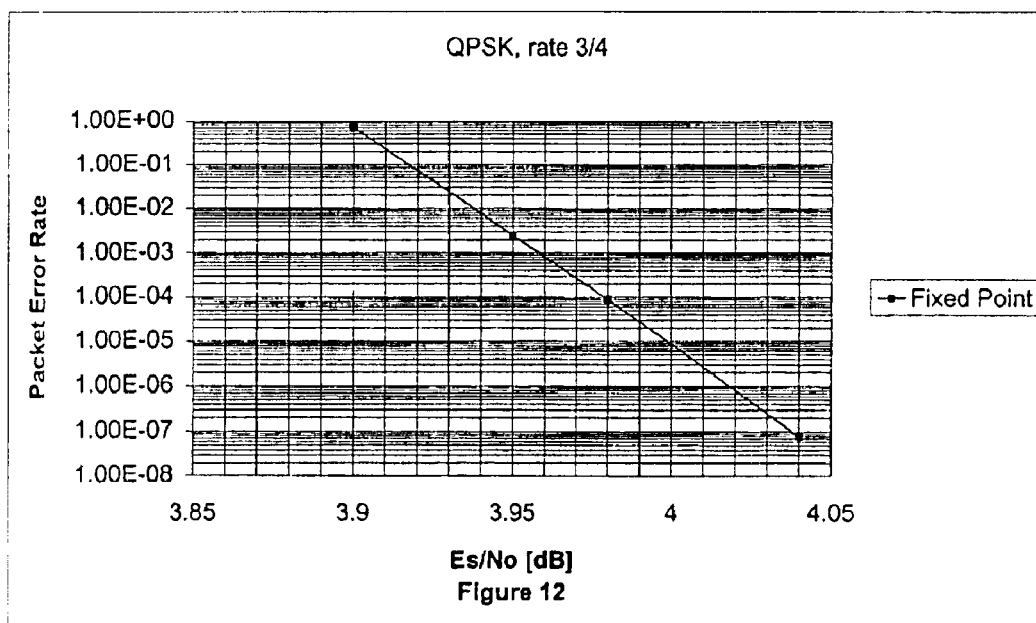
Figure 13:
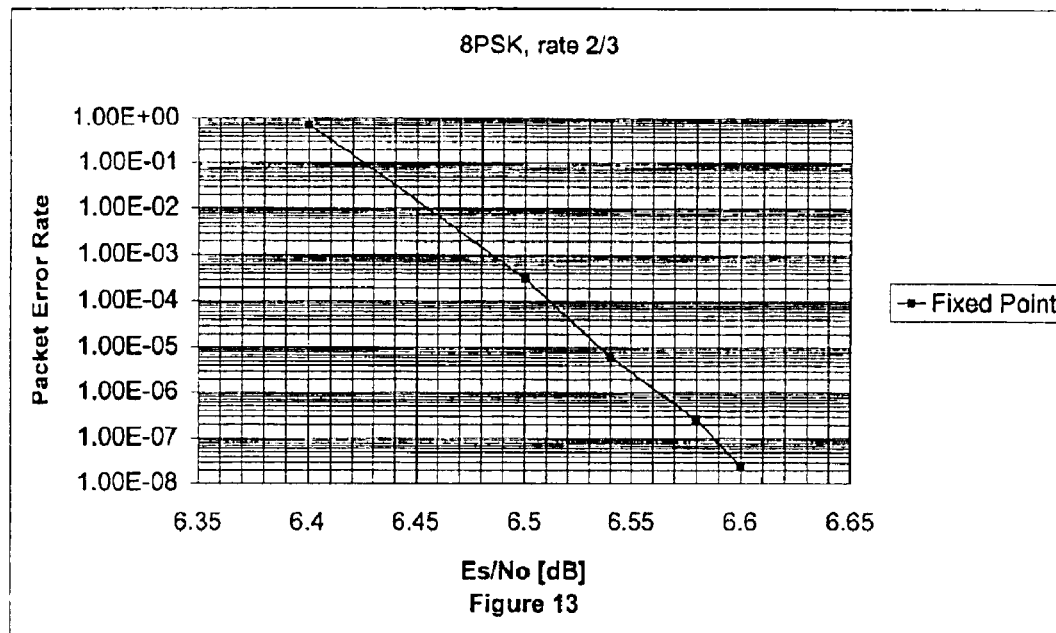
Figure 14:
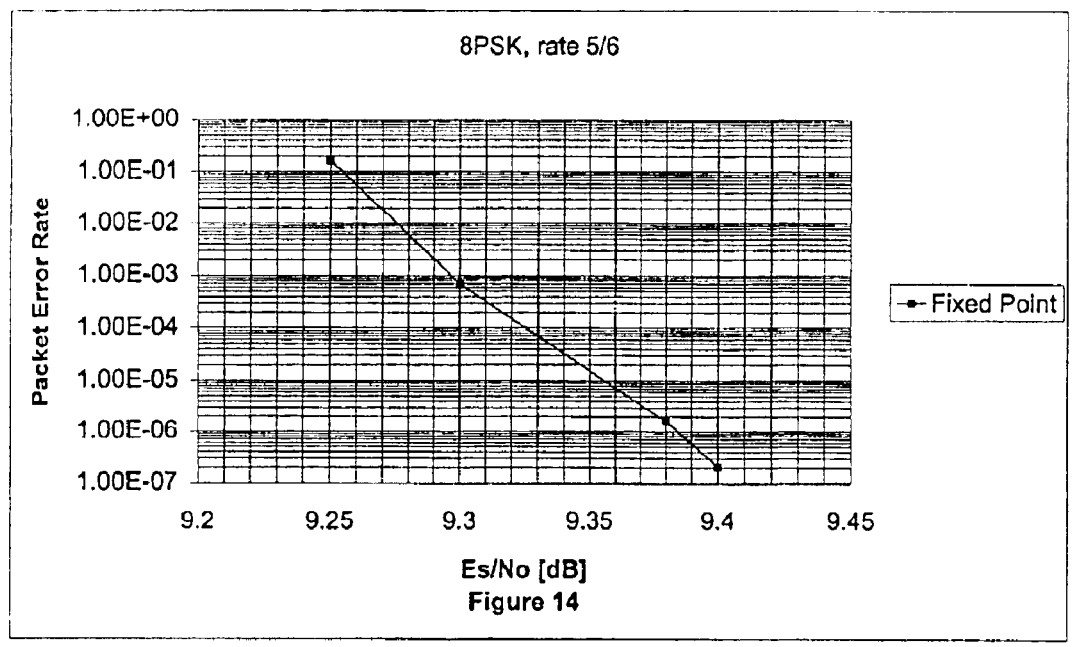

FIG. 11 provides a performance graph with at least 25 independent errors for every Es/No point provided. The embodiment corresponding to the performance results of FIG. 11 used QPSK ½. FIG. 12 provides a performance graph with at least 25 independent errors for every Es/No point provided. The embodiment corresponding to the performance results of FIG. 12 used QPSK ¾. FIG. 13 provides a performance graph with at least 25 independent errors for every Es/No point provided. The embodiment corresponding to the performance results of FIG. 13 used 8PSK 2/3. FIG. 14 provides a performance graph with at least 25 independent errors for every Es/No point provided. The embodiment corresponding to the performance results of FIG. 14 used 8PSK ⅚.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A data encoder for encoding a codeword having a plurality of symbols for transmission through a data channel, the data encoder comprising:
    a turbo encoder having:
        an interleaver for receiving the codeword and providing an interleaved codeword;
        first and second recursive systematic convolutional (RSC) encoders, the first RSC encoder for receiving the codeword and providing first parity bits in accordance with the codeword, the second RSC encoder for receiving the interleaved codeword from the interleaver and providing second parity bits in accordance with the interleaved codeword;
        a puncturer for receiving the codeword, the first parity bits and the second parity bits, and for puncturing at least the first and second parity bits in accordance with a pattern of a desired code rate; and
        a mapper for receiving the punctured parity bits, and for providing signal sets in accordance with the desired code rate; and
    a Reed-Solomon encoder for encoding the codeword prior to receipt by the turbo encoder.

2. The data encoder of claim 1, wherein the interleave, is a modified dithered relatively prime interleaver.

3. The data encoder of claim 1, wherein the first and second RSC encoders are rate 2/3, 8 state RSC encoders.

4. The data encoder of claim 3, wherein the codeword is a 25600-bit frame.

5. The data encoder of claim 4, wherein the RSC encoders employ tail-biting termination, and polynomials of the each of the first and second RSC encoders are chosen such that for a final state of a first pass through the RSC encoder having bit positions [0 1 2 3 4 5 6 7], a final state of a second pass through the RSC encoder yields bit positions [0 5 1 4 2 7 3 6].

6. The data encoder of claim 1, further including a Forney interleaver disposed between the Reed-Solomon encoder and the turbo encoder, for interleaving the symbols in the codeword prior to receipt by the turbo encoder.

7. The data encoder of claim 1, wherein the turbo encoder includes a further interleaver coupled to a further RSC encoder, the further interleaver receiving the codeword and providing a further interleaved codeword to the further RSC encoder, the further RSC encoder providing further parity bits to the puncturer.

8. A turbo encoder system for encoding a digital signal including a codeword having a plurality of symbols, comprising:
    a Reed-Solomon encoder, for receiving and encoding the codeword;
    a Forney interleaver, for receiving from the Reed Solomon encoder, the encoded codeword, and for interleaving the symbols in the codeword according to a predetermined interleaver index; and
    a turbo encoder for receiving the interleaved encoded codeword from the Forney interleaver, the turbo encoder having at least one modified dithered relatively prime interleaver for interleaving the codeword, at least two RSC encoders for encoding the codeword and the interleaved codeword, respectively, and a puncturer for puncturing the codeword, the encoded codeword, and the interleaved and encoded codeword to provide a turbo codeword.

9. The turbo encoder system of claim 8, wherein the at least two RSC encoders are rate 2/3, 8 state RSC encoders using tail-biting termination.

10. The turbo encoder system of claim 9, wherein for a 25600-bit codeword, polynomials of the at least two RSC encoders are chosen such that for a final state of a first pass through the RSC encoder having bit positions [0 1 2 3 4 5 6 7], a final state of a second pass through the RSC encoder yields bit positions [0 5 1 4 2 7 3 6].

11. A turbo coding method, comprising the steps of:
encoding a plurality of codewords according to a Reed-Solomon (RS) outer code;
interleaving the plurality of RS encoded codewords using a Forney interleaver;
providing each of the plurality of interleaved codewords to a first RSC encoder for encoding using a systematic recursive convolutional constituent (RSCC) code to provide first purity bits;
providing each of the plurality of interleaved codewords to an interleaver coupled to a second RSC encoder for interleaving each codeword and for encoding each doubly interleaved codeword using a RSCC code to provide second parity bits;
puncturing the first and second parity bits in accordance with a pattern of a desired code rate; and
mapping the punctured parity bits to provide signal sets in accordance with the desired code rate.

12. The turbo coding method of claim 11, wherein the RSCC code is a rate 2/3, 8 state RSCC code.

13. The turbo encoding method of claim 12, wherein for a digital signal which is a 25600-bit frame, RSCC polynomials are chosen such that a final state of a first pass through the RSC encoder having bit positions [0 1 2 3 4 5 6 7], a final state of a second pass through the RSC encoder yields bit positions [0 5 1 4 2 7 3 6].

14. The turbo coding method of claim 11, wherein the interleaving of each of the plurality of RS encoded codewords consists of interleaving using a modified dithered relatively prime interleaving mapping.

15. The turbo coding method of claim 11, further including the steps of transmitting the signal sets, receiving the transmitted signal set, and decoding the signal set using standard log-maximum-a-posteriori-probability (log-MAP) decoding.

16. The turbo coding method of claim 15, wherein the decoding further includes early stopping.

* * * * *